(12) United States Patent
Kamada

(10) Patent No.: US 9,822,959 B2
(45) Date of Patent: Nov. 21, 2017

(54) LIGHT EMITTING DEVICE

(71) Applicant: NICHIA CORPORATION, Anan-shi, Tokushima (JP)

(72) Inventor: Kazuhiro Kamada, Tokushima (JP)

(73) Assignee: Nichia Corporation, Anan-shi (JP)

( * ) Notice: Subject to any disclaimer, the term of this patent is extended or adjusted under 35 U.S.C. 154(b) by 0 days.

(21) Appl. No.: 14/037,545

(22) Filed: Sep. 26, 2013

(65) Prior Publication Data

US 2014/0092597 A1    Apr. 3, 2014

(30) Foreign Application Priority Data

Sep. 28, 2012   (JP) ................................ 2012-215839

(51) Int. Cl.
    F21S 4/24    (2016.01)
    F21V 23/00   (2015.01)
    F21S 4/28    (2016.01)
    F21S 4/22    (2016.01)

(52) U.S. Cl.
    CPC .............. *F21V 23/002* (2013.01); *F21S 4/28* (2016.01)

(58) Field of Classification Search
    CPC ....... F21Y 2105/00–2105/008; F21Y 2103/00–2103/006; H05B 33/00–33/28; F21V 23/00–23/06; F21V 23/002; F21S 4/28
    See application file for complete search history.

(56) References Cited

U.S. PATENT DOCUMENTS

| | | | | |
|---|---|---|---|---|
| 2008/0117619 A1* | 5/2008 | Pang | ......................... | F21K 9/00 362/84 |
| 2009/0303728 A1* | 12/2009 | Ueji | ......................... | H01L 33/60 362/296.01 |
| 2011/0175536 A1* | 7/2011 | Fujita | ......................... | F21S 8/02 315/185 R |
| 2014/0268780 A1* | 9/2014 | Wang | ..................... | F21V 19/003 362/249.06 |
| 2015/0138773 A1 | 5/2015 | Fujita et al. | | |
| 2016/0178174 A1 | 6/2016 | Fujita et al. | | |

FOREIGN PATENT DOCUMENTS

| | | |
|---|---|---|
| JP | 05-025749 U | 4/1993 |
| JP | 2001-203395 A | 7/2001 |
| JP | 2003-100110 A | 4/2003 |
| JP | 2008-177402 A | 7/2008 |
| JP | 2012-003907 A | 1/2012 |
| JP | 2012-146470 A | 8/2012 |
| JP | 3178712 U | 9/2012 |
| WO | 2010-018682 A1 | 2/2010 |

* cited by examiner

*Primary Examiner* — Anh Mai
*Assistant Examiner* — Nathaniel Lee
(74) *Attorney, Agent, or Firm* — Global IP Counselors, LLP

(57) ABSTRACT

A light emitting device includes a substrate member having a flexible base member, a plurality of wiring portions disposed on the base member, and a covering layer covering the wiring portions and having openings exposing a part of wiring portions, a plurality of light emitting elements electrically connected to the wiring portions, and a plurality of sealing members sealing the plurality of light emitting elements, respectively. The light emitting device has a weight of 1 g/cm² or less.

23 Claims, 5 Drawing Sheets

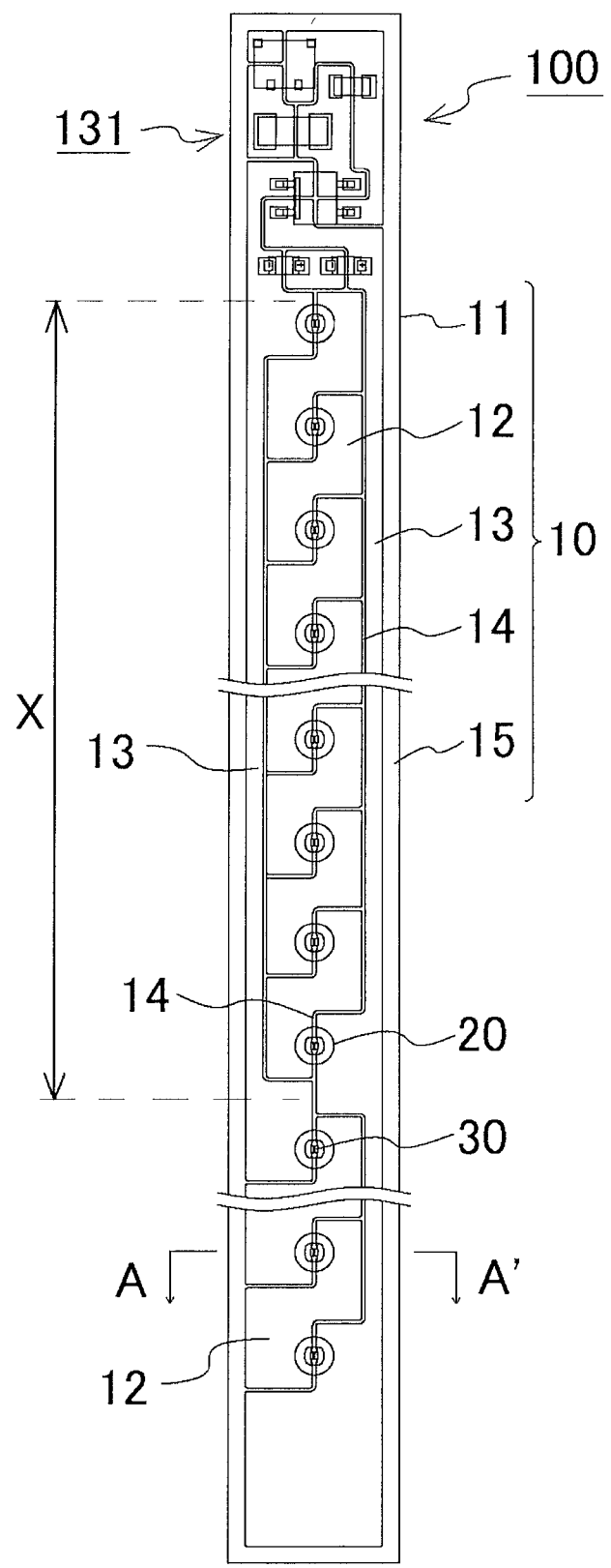

LIGHT EMITTING DEVICE

CROSS-REFERENCE TO RELATED APPLICATION

This application claims priority to Japanese Patent Application No. 2012-215839, filed on Sep. 28, 2012. The entire disclosure of Japanese Patent Application No. 2012-215839 is hereby incorporated herein by reference.

BACKGROUND OF THE INVENTION

1. Field of the Invention

The present invention relates to a light-weight light emitting device with a flexible substrate member.

2. Background Information

In recent years, LED modules and COBs (chip on boards) using LEDs of a shell shape type or a SMD type are started being used. But such LED modules and COBs require sufficient heat dissipation in order to prevent deterioration in the light emitting efficiency and shortening of life time of the LEDs and the chips. For this reason, various ways of improvement in heat dissipation, such as the use of aluminum plates which have high thermal conductivity for the substrate member to mount the LEDs or the chips, or arrangement of heat-transfer layer made of graphite etc., on the back-surface of such substrate members are presently being studied (for example, see JP 2003-100110A and JP 2012-3907A).

SUMMARY OF THE INVENTION

It is an aim of the present invention to provide a light emitting device with a lighter weight.

The embodiments include the aspects described below.

(1) A light emitting device includes a substrate member having a flexible base member, a plurality of wiring portions disposed on the base member, and a covering layer covering the wiring portions and having openings exposing a part of wiring portions, a plurality of light emitting elements electrically connected to the wiring portions, and a plurality of sealing members sealing the plurality of light emitting elements, respectively. The light emitting device has a weight of 1 g/cm$^2$ or less.

(2) A light emitting device includes a substrate member, a light emitting element mounted on the substrate member, and a sealing member sealing the light emitting element. The substrate member has a ratio of a longitudinal length to a lateral length in a range of 2:1 to 200:1. The sealing member has a diameter or length of about twice or greater, more preferably about eight times or less with respect to a length of a side of the light emitting element.

The present invention can provide a light emitting device in which the performance and operation life time etc., are improved compared to that of the conventional fluorescent lamps, LED modules, COBs etc., along with realization of further reduction of weight, which allow the device to be applicable across a wider range of various conformations and applications.

BRIEF DESCRIPTION OF THE DRAWINGS

FIG. 1B is a schematic plan view showing an embodiment of a light emitting device according to the present invention.

DETAILED DESCRIPTION OF EMBODIMENTS

Figure 1A:
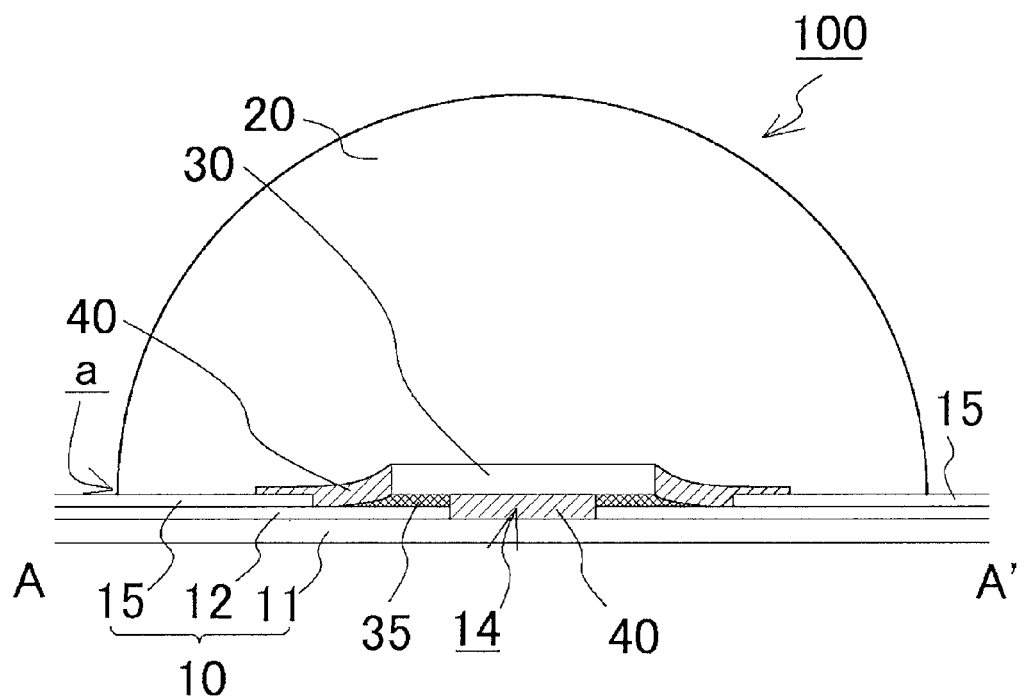
FIG. 1A is a schematic cross-sectional view of a light emitting device according to an embodiment of the present invention shown in FIG. 1B, taken along line A-A' in FIG. 1B.

A light emitting device according to the present disclosure includes mainly, a substrate member, a light emitting element, and a sealing member.

A light emitting device can include a substrate member having a flexible base member, a plurality of wiring portions disposed on the base member, and a covering layer covering the wiring portions and having openings exposing a part of wiring portions, a plurality of light emitting elements electrically connected to the wiring portions, and a plurality of sealing members sealing the plurality of light emitting elements, respectively. The light emitting device preferably has a weight of 1 g/cm$^2$ or less.

The light emitting device preferably further includes an electronic component.

In the light emitting device, the plurality of light emitting elements are preferably arranged at a density of 0.1 to 10/cm$^2$.

The light emitting device is preferably configured to emit light with a luminosity of at least 900 lm at a color temperature of 5000 K.

In the light emitting device, the substrate member preferably has an elongated shape extending in a longitudinal direction, and a ratio of a longitudinal length to a lateral length is in a range of 2:1 to 200:1.

In the light emitting device, the substrate member preferably has an elongated shape extending in a longitudinal direction, and a ratio of a longitudinal length to a lateral length is in a range of 2:1 to 200:1.

In the light emitting device, the sealing member preferably has a diameter or length of about twice or greater, more preferably about eight times or less with respect to a length of a side of the light emitting element.

A light emitting device can include a substrate member, a light emitting element mounted on the substrate member, and a sealing member sealing the light emitting element. The substrate member preferably has a ratio of a longitudinal length to a lateral length is in a range of 2:1 to 200:1. The sealing member preferably has a diameter or length of about twice or greater, more preferably about eight times or less with respect to a length of a side of the light emitting element.

The light emitting device preferably has a weight of 1 g/cm$^2$ or less.

In the light emitting device, the substrate member preferably has a width of 0.5 cm to 5 cm and a length of 100 cm to 150 cm.

In the light emitting device, the substrate member more preferably has a width of 0.5 cm to 5 cm and a length of 20 cm to 70 cm.

In the light emitting device, the substrate member preferably includes a flexible substrate member and a wiring substrate member.

In the light emitting device, the wiring substrate member is preferably covered with a covering member having an opening.

Substrate Member

The substrate member at least includes a base member, a plurality of wiring portions disposed on the base member, and a covering layer disposed on the wiring portions. The base member is a basic component of the light emitting device and has flexibility. As long as the flexibility can be maintained, the base member can be formed by using an appropriate material according to the purpose and applications, and also in view of mounting of the light emitting element, the reflectance, adhesiveness with other members. Examples of such material include an insulating or conductive material such as plastic and metal foil. More specifically, a resin such as polyethylene terephthalate and polyimide may be preferable. Particularly, in the case where solder is used for mounting light emitting elements, polyimide, which has high thermal resistance, can be more preferably used. In addition, a material constituting the base member may contain a material having high optical reflectance (for example, a white filler such as titanium oxide). The thickness of the base member can be in a range so as not to impair the flexibility, and for example, the thickness of about 10 µm to 500 µm can be employed, and about 10 µm to 200 µm or further about 10 µm to 100 µm is preferable.

The base member can be made with an appropriate shape (size, length) according to the aim and applications. The base member substantially defines the shape of the substrate member, and the example of the shape include a quadrangular shape, a rectangular shape, a polygonal shape, a circular shape, an elliptical shape, or a shape which is a combination of these shapes. In the case where the light emitting device according to an embodiment of the present invention is used for straight tube-type lighting equipments, an elongated shape extending in the longitudinal direction can be preferably employed. For example, the ratio in the longitudinal direction to the lateral direction can be about 2 to 200:1, about 4 to 200:1, or about 5 to 200:1, which can be about 10 to 30:1 and more preferably can be about 10 to 20:1. A flexible base member can be used in a deformed state such as in a curved or bent state. Therefore, in the case where one light emitting device to be arranged, the flexible base member having a width and length several mm to several cm larger than the width and length of the housing member of the device can be used. Also, even in the case where a plurality of light emitting devices are to be arranged, the total area of the devices can be about several mm to several cm larger than the housing member of the devices.

For example, in the case of light source for straight tube-type lighting, more specifically, in the case of a straight tube-type lighting of about 120 cm in length (a 40-type), one light emitting device employing a substrate member (base member) of 0.5 cm to 5 cm in width, 100 cm to 150 cm in length may be used, or a plurality of light emitting devices each employing a substrate member (base member) of 0.5 cm to 5 cm in width, 20 cm to 70 cm in length may be used.

For the backlight light source for liquid crystal display televisions, an appropriate shape (size, length, and width) can be employed corresponding to the size (the number of inches) of the liquid crystal panel to be used. For example, in the case where the light emitting device is used for the backlight of a 55-inch liquid crystal display television in direct illumination-type application, 15 units of the base members each having a width of 80 mm and a length of 680 mm may be employed, or 30 units of the base members each having a width of 40 mm and a length of 680 mm may be employed. In a similar manner, in the case where the light emitting device is used for the backlight of a 55-inch liquid crystal display television in edge-type application, 4 units of the base members each having a width of 3 mm to 20 mm and a length of 340 mm may be employed, or 2 units of the base members each having a width of 3 mm to 20 mm and a length of 680 mm may be employed. The flexible base member can be manufactured by using roll-to-roll method, in which several units of such an elongated base member (substrate member) can be processed together. In this case, sprocket holes may be provided in the base member.

The plurality of wiring portions are formed as electrically conductive members and disposed on one surface of the base member and directly or indirectly connected to the light emitting element. The wiring portions may be made of a thin an electrically conductive thin layer of single-layer or stacked-layer structure of metal such as copper or aluminum or alloy thereof. The wiring portion may be arranged not only on a single surface of the base member, but also an inner side or on another surface of the substrate member according to the type of the substrate member. It is preferable that the wiring portions have a thickness which does not impair their flexibility and, for example, a thickness of 8 µm to 150 µm can be employed.

The shape (pattern) of the plurality of wiring portions is not specifically limited, and generally, a similar shape or a shape conforming to the shape or pattern of the wiring of the substrate member for mounting the light emitting elements or for connecting to the light emitting elements, or with further consideration of heat dissipation and/or mechanical strength can be preferably employed. For example, a polygonal shape such as a crank shape, a triangular shape, and a quadrangular shape, a shape with no sharp corners such as a circular shape and an elliptical shape, and a shape of those with partially irregular shape can be employed singly or in combination. The corners of the wiring portions are preferably rounded.

The plurality of wiring portions are arranged spaced apart from each other. Such terminal portions are made up of a pair of positive and negative terminals, and the number of the wiring portions which constitute the pair of the terminals is not specifically limited. For example, each of the pair of wiring portions may be made up of a single wiring portion or a plurality of wiring portions.

Arranging the wiring portions in a relatively large area with a combination of wiring portions having various shapes can increase the degree of freedom in arrangement of the light emitting device. For example, with a rectangular base member, it can be possible that six light emitting elements are arranged three in the longitudinal direction and two in the lateral direction as one block and connected in parallel, then, twelve blocks are arranged in the longitudinal direction and connected in series by the pair of positive and negative wiring portions. The base member may have an approximately square shape, an approximately circular shape, or an approximately ellipsoidal shape, and one light emitting element may be connected to ordinary, positive and negative wiring portions respectively.

In addition to the wiring portions directly or indirectly electrically connected to corresponding light emitting elements (that is, the wiring portions for providing electrical continuity), a wiring portion which has a similar shape or a different shape and does not contribute to conduction of electricity and may also be arranged. The wiring portion which does not contribute to providing electrical continuity can serve as a heat releasing member or a mounting portion of the light emitting element. For example, in the case where the base member has an elongated shape extended in the longitudinal direction, the wiring portions which do not contribute to providing electrical continuity are preferably arranged extended to the longitudinal end portions and at the both sides of the wiring portions in the lateral direction. The wiring portions preferably have terminals which respectively allow supply of electricity to the wiring portions. This arrangement allows supply of electricity to light emitting elements from external power source. In the case where a part of such wiring portions are arranged on approximately the entire surface of the flexible base member (preferably arranged without having a gap), stress due to bending of the substrate member etc., loaded on the light emitting elements and the sealing member to be described later can be reduced. More specifically, in the case where a base member of elongated shape is used, the wiring portions are preferably arranged elongated along the longitudinal direction of the base member, and more preferably, the wiring portions are arranged with a length of ⅓ to 1 of the longitudinal length of the base member.

As described above, on one surface of the base member, the plurality of wiring portions are spaced apart from each other and the separation creates grooves where the wiring portions are not disposed (in other words, portions where the base member etc., are exposed). The grooves are arranged between the wiring portions, so that the shapes of the grooves are in conformity to the shapes of the wiring portions, which may be, for example, a crank shape. The width of the grooves is preferably narrower than the width of the wiring portions, in other words, the wiring portions can be disposed with a larger area, and for example, a width of about 0.05 mm to 5 mm can be employed.

The wiring portions (both wiring portions contribute/not contribute to electrical continuity) are preferably arranged on the base member respectively with the largest possible area, so that heat dissipation can be improved. Further, in the case where the a flexible substrate member is used, because the wiring portions are arranged on the whole area of one surface of the base member with relatively large areas, appropriate strength can be added while maintaining its flexibility. Thus, disconnection of wiring portions and breakage of substrate member due to bending of the flexible substrate member can be prevented effectively. More specifically, with respect to the area of the base member, the wiring portions are arranged with an area preferably 50% or greater, more preferably 70% or greater, further preferably 80% or greater, 85% or greater, or 90% or greater. Also, in the case where electrical isolation is needed between the wiring portions, in order to secure the isolation, the wiring portions are preferably disposed with the areas of about 99% or less, about 98% or less, or about 95% or less.

The covering layer covering the wiring portions preferably can serve as a reflective layer to reflect the light emitted from the light emitting element. It is preferable that the covering layer has, as described later, an opening where the wiring portions are exposed, and except for the opening, the covering portion covers approximately the entire surface of the substrate member. In addition, it is preferable that the covering portion also covers the grooves between the wiring portions.

In order to connect the light emitting element with a pair of positive and negative wiring portions, the opening is arranged to expose the wiring portions. The shape and size of the opening is not specifically limited, but a minimum size sufficient for electrical connection of the light emitting element with the wiring portions is preferable. The number of the openings provided for one substrate member is not specifically limited and for example, appropriately determined according to the number of the light emitting elements to be mounted on one substrate member.

Generally, the number and arrangement of light emitting elements are adjusted according to the output power, light distribution, or the like, and accordingly, the number and the positions of the openings are determined. The number of the openings can either be the same or different with respect to the number of the light emitting elements to be mounted. For example, in the case where twenty light emitting elements to be mounted with one light emitting element in one opening, 20 openings can be arranged in the covering layer. Or in the case where two or more light emitting elements to be mounted in one opening, 10 or less openings can be arranged. In some cases, the light emitting elements may not be mounted in the openings. For example, in the case where the light emitting devices are manufactured in several ranks (for example, light emitting devices of different outputs), with the use of a same-type substrate member (that is, the substrate member have a same number and arrangement of the openings provided in the covering layer), different optical output can be obtained by changing the number of the light emitting elements to be mounted in the openings. In this case, some openings may not have any light emitting elements mounted therein. A region lacking the covering layer (i.e. an opening) may be formed in a region for arranging a member or the like, such as the terminal described above, which supplies electricity to the light emitting elements. In the case of flip-chip mounting, a part of groove is preferably exposed in a single opening.

The covering layer can be formed by using a resin such as a phenol resin, an epoxy resin, a BT resin, a PPA, a silicone resin or a urea resin. Also, the covering layer is preferably made of a material which reflects emission of the light emitting element and wavelength-converted light by a wavelength converting member to be described later. For this reason, a filler such as $SiO_2$, $TiO_2$, $Al_2O_3$, $ZrO_2$, or MgO is preferably contained in the resin described above.

The covering layer is preferably disposed with a relatively small thickness, and particularly preferable that the covering layer is disposed so that the upper surface of the light emitting element is higher than the covering layer. More specifically, the thickness of the covering layer may be about 5 μm to 50 μm.

The substrate member having such a structure has flexibility. This arrangement allows its use in various applications, with in situ shape with the light emitting element mounted thereon or with a shape appropriately changed. The total thickness of the substrate member can be adjusted according to the thickness of each of the components described above, and for example, about 0.05 to 0.15 mm, preferably 0.07 to 0.12 mm can be employed. The substrate member may be formed by stacking the base member, the wiring portions, and the covering layer which are described above with applying an adhesive agent etc. (for example, a silicone-based adhesive agent, an epoxy-based adhesive agent, or an acrylic adhesive agent, with a thickness of several micrometers to several tens of micrometers) between them, or by stacking them with the use of plating, thermal compression, or the like. The weight of the substrate member can be appropriately adjusted according to the materials and thickness of the base member, the wiring portions, and the covering layer, and the size and number of the openings, and for example, a weight of 1 $g/cm^2$ or less, 0.9 $g/cm^2$ or less, 0.8 $g/cm^2$ or less, 0.7 $g/cm^2$ or less, 0.4 $g/cm^2$ or less, or 0.1 g/cm² or less is preferably employed. Accordingly, even with an addition of the weight of the light emitting elements etc., to be mounted on the substrate member, a light emitting device of very light weight can be realized.

Light Emitting Element

A plurality of light emitting elements are arranged on the substrate member, with electrically connected to the wiring portions which are exposed from the covering layer. Particularly, in the above-described openings of the covering layer on the substrate member, the light emitting elements are preferably arranged respectively on the two wiring portions in a bridged manner or arranged on a single wiring portion. With such arrangements, the light emitting elements can be electrically connected easily to the pair of positive and negative wiring portions respectively. The number and/or tone of color tone and/or arrangement of a plurality of light emitting elements are determined to satisfy the output and light distribution designed for the light emitting device. It is therefore accordingly the shape and arrangement of the wiring portions and/or openings of the covering layer are adjusted and the light emitting elements are mounted at the determined positions.

The light emitting element includes a semiconductor structure, a p-side electrode, and an n-side electrode. The semiconductor structure, for example, includes an n-type layer, an active layer, and a p-type layer respectively made of a gallium nitride-based semiconductor and stacked in the order on a light-transmissive sapphire substrate member. It is not limited to gallium nitride-based semiconductors, a II-VI based semiconductor or a III-V based semiconductor may be used. The n-side electrode and the p-side electrode can be formed with a single layer or staked-layer of known materials.

The light emitting element may be mounted in the substrate member in a flip-chip manner or a face-up manner. In the case of flip-chip mounting, the p-side electrode and the n-side electrode of the light emitting element are connected to a pair of wiring portions via a pair of bonding member respectively. For the bonding member, for example, a solder of Sn—Ag—Cu system, Sn—Cu system, or an Au—Sn system, or a metal bump such as Au can be used. In the case of face-up mounting, the light emitting element is fixed on the base member (on the wiring portion) by an insulating bonding member such as a resin or by an electrically conductive bonding member as described above, and then, electrically connected to the wiring portions via wires. In the case where the substrate member of the light emitting element is electrically conductive, the light emitting element is electrically connected by the bonding member as described above.

In addition to the light emitting elements, an electrical component (for example a protective element such as a Zener diode or a bridge diode; related components such as a terminal for external connection described above, a fuse, and/or a resistance) may be arranged on one surface of the substrate member. Such a protective element and related component may be arranged together with the light emitting element in the opening where the light emitting element is mounted or in a different opening provided for them. But, they are preferably arranged at locations so as not to absorb the light from the light emitting element. The protective element is preferably arranged at an appropriate position, for example, one protective element is mounted on a wiring portion, to which a plurality of light emitting elements are connected in series, at a position near a connector regardless of the arrangement of the light emitting elements.

The brightness of the light emitting elements can be adjusted by the structure, the constituent materials, the applied voltage, or the like. Also, the brightness of the light emitting device itself can be adjusted by increasing or decreasing the number of the light emitting elements. Thus, in the case of a straight-tube-type (40 W type) light source for lighting, the light emitting device according to the embodiments of the present invention can realize a total brightness of the light emitting elements 2000 lm or greater at a color temperature of 5000K, by appropriately adjusting the type and/or the number of the light emitting elements. Accordingly, while maintaining equivalent or greater performance than the fluorescent lamps of various types such as straight-tube types, circular types, and compact types that have been conventionally used, the light emitting devices of the invention have a lighter weight, and can be used in various application sites or locations or conformations.

Also, in the case of a light source for backlight, the total brightness of the light emitting elements can realize 900 lm or greater at a color temperature of 5000 K. Accordingly, the degree of freedom can be further expanded compared to that of the LED modules in which LEDs are mounted on a rigid substrate member made of such as glass epoxy, or further, compared to that of the conventional fluorescent lamps, and thus applications at various sites, locations and conformations which can not be realized in the conventional fluorescent lamps etc., become possible.

For example, the number (density) of the light emitting elements in one light emitting device can be about 0.1 to 10/cm². With the use of the substrate member described above, appropriate adjustment of the strength for the light emitting elements, heat dissipation of the light emitting element, supply of electricity, and the like, become possible, so that such a density of the light emitting elements can be realized.

Sealing Member

The plurality of sealing members seal (cover) the plurality of light emitting elements respectively on the substrate member. One light emitting element is preferably covered with one sealing member, but two or more light emitting elements may be enclosed by one sealing member. The sealing member preferably has transparency to the light from the light emitting element and light resistance and electrical insulation properties. The sealing member is preferably arranged to cover all the openings of the covering layer described above, but may be arranged not to cover some of the openings. In the specification, the term "transparency to light" means properties of transmitting about 60% or greater emission of the light emitting element, more preferably 70% or greater or 80% or greater of light emitted from the light emitting element.

The sealing member can be formed for example by using a silicone resin composition, a modified silicone resin composition, an epoxy resin composition, a modified epoxy resin composition, an acrylic resin composition, a silicone resin, an epoxy resin, a urea resin, a fluororesin, or a hybrid resin containing one or more of those resins.

The sealing member preferably includes a wavelength converting member such as a fluorescent material capable of absorbing light from the light emitting element and emitting light of different wavelength. Examples of such a wavelength converting member include an oxide-based fluorescent material, a sulfide-based fluorescent material, and a nitride-based fluorescent material. For example, in the case where a gallium nitride based light emitting element to emit blue light is used as the light emitting element, fluorescent materials to absorb blue light, such as a YAG-based fluorescent material or a LAG-based fluorescent material to emit yellow to green light, a SiAlON-based fluorescent material (β-SiAlON-based fluorescent material) to emit green light, and a SCASN-based fluorescent material and a CASN-based fluorescent material to emit red light, are preferably used singly or in combination. Particularly, for the light emitting devices used for the display devices such as backlights of liquid crystal displays and TV-screens, a SiAlON fluorescent material and a SCASN fluorescent material are preferably used singly or in combination. Also, for lighting applications, a YAG-based fluorescent material or a LAG-based fluorescent material and a SCASN-based fluorescent material or a CASN-based fluorescent material are preferably used in combination. The sealing member may contain a light diffusing agent (barium sulfate, titanium oxide, aluminum oxide, silicon oxide, or the like).

The shape of the sealing member is not specifically limited, but in view of light luminous intensity distribution and directivity of the light emitted from the light emitting element, a concave lens shape or a convex lens shape is preferably employed. Of those, a hemispherical convex lens shape may be most suitably employed.

The size of the sealing member is not specifically limited and appropriately adjusted in view of the brightness, directivity, etc., of the light emitting device. Particularly, the sealing member preferably has a size which can secure wider contact area with a resin layer to be described below, but in the case where a flexible substrate member is employed, a size which does not impair the flexibility of the flexible substrate member is preferable. For example, the sealing member preferably has a size which allows the complete covering of the light emitting element or greater, with a diameter or length of about twice or greater, more preferably about eight times or less with respect to a length of a side of the light emitting element. More specifically, a side (or diameter) of about 1 mm to 4 mm can be employed. The sealing member may be disposed with its outer periphery arranged on the covering layer, or in the opening of the covering layer.

As long as covering the light emitting element, the sealing member may not be directly in contact with the light emitting element and may have a space between the light emitting element, or the sealing member is arranged so that over the light emitting element, it contacts the light emitting element, but at the outer periphery of the light emitting element, it is not necessarily directly in contact with the covering layer which constitutes the substrate member and with the wiring portions, and disposed via the resin layer to be described later.

Resin Layer

The resin layer may be disposed laterally (outer periphery) to the light emitting element, for example, in the openings formed in the covering layer, outer periphery of the openings, or from the inner side of the openings toward the outer periphery of the openings, that is, extending onto the covering layer. Also, regardless of the presence of the wiring portions, the resin layer may be disposed, for example, in the groove portion between the wiring portions and/or directly under the light emitting element.

The resin layer is preferably in contact with the outer edge (side surfaces) of the light emitting element. Generally, the light emitting element is mounted on the substrate member by using a bonding member etc., but a part of the surfaces of the bonding member and/or the base member generally tends to develop deterioration due to light than in the material of the resin layer. For this reason, the resin layer is preferably arranged so that in the vicinity of the light emitting element, a part of the surface etc., of the bonding member and/or the base member is covered with the resin layer. With this arrangement, the relatively intense light emitted from the light emitting element can be prevented from directly irradiating the bonding member and/or the base member, so that optical degradation of the constituent members of the light emitting device can be efficiently prevented.

The end portion of the resin layer at the opposite side of the light emitting element may be located either at an inner side of the outer edge, in conformity to the outer edge, or at an outer side of the outer edge of the sealing member to be described later. Of those, the end portion of the resin layer is preferably disposed in conformity to the outer edge, or at an outer side of the outer edge of the sealing member. With this arrangement, the contact area between the resin layer and the sealing member can be easily secured, so that the sealing member can be adhered more tightly to the light emitting device, particularly to the resin layer.

In other words, the size of the resin layer, that is, the planar dimension of the light emitting device in light extracting direction may be similar, larger, or smaller than the planar dimension of the sealing resin member, excluding the planar dimension of the light emitting element. Particularly, the size of the resin member may be about ⅕ to 3 times, preferably about ¼ to 3 times, and more preferably ⅓ to 1.5 times of the planar dimension of the sealing resin member excluding the planar dimension of the light emitting element. Thus, with a large planar dimension of the resin layer, the contact area with the sealing member increases as described later, so that due to the adhesion of both, the adhesion of the sealing member of the light emitting device can be further enhanced.

The resin layer may be disposed, for example, with a thickness in a range of several micrometers to several hundred micrometers. Particularly, portions of the resin layer in contact with the light emitting element preferably has a thickness corresponding to or less than the height of the side surfaces of the light emitting element. In the case where the resin layer is disposed in the whole portion of the opening, the portion in contact with the periphery of the opening preferably has a thickness not exceeding the depth of the opening. Particularly preferably the thickness of the resin layer decreases from the light emitting element outward (outer side with respect to the center of the light emitting element).

The resin layer can be formed for example by using a resin having its base polymer of, a silicone resin composition, a modified silicone resin composition, an epoxy resin composition, a modified epoxy resin composition, an acrylic resin composition, a silicone resin, an epoxy resin, a urea resin, a fluororesin, or a hybrid resin containing one or more of those resins. Of those, a resin containing a silicone resin and/or an epoxy resin as its base polymer is preferable. In the specification, the term "a base polymer" means a resin having a highest content of the materials constituting the resin layer. The resin layer preferably contains, for example, a reflective material and/or diffusion material such as $SiO_2$, $TiO_2$, $Al_2O_3$, $ZrO_2$, and $MgO$. With this arrangement, light can be reflected sufficiently. The resin layer may be made of a single material or a combination of two or more materials.

With this arrangement, the reflectance of light can be adjusted and also the linear expansion coefficient of the resin can be adjusted.

Particularly, the resin layer is preferably formed, including the same polymer as in the sealing member as described above, more particularly, including the same polymer constituting the base polymer of the resin layer, and more preferably including the same polymer of the base polymer of the sealing member as the base polymer of the resin layer. With this arrangement, at the portion where the sealing member is in contact with the resin layer, suitability and compatibility of the both resin members are preferable, so that the adhesion with the resin layer can be further secured, and strong adhesion of the sealing member in the light emitting device can be realized.

The light emitting device according to the embodiments of the present invention includes, as described above, a flexible substrate member which uses a flexible base member, and while maintaining/improving the performance such as brightness and operation life time etc., required in the conventional usage, a significant reduction of weight can be realized. That is, the light emitting device according to the embodiments of the present invention at least includes a substrate member and a plurality of light emitting elements and sealing members, and can realize a weight of 1 $g/cm^2$ or less, preferably 0.7 $g/cm^2$ or less, 0.4 $g/cm^2$ or less, or 0.1 $g/cm^2$ or less. More preferably, even with related components, such as a terminal for connection with an external power source, a protective element, a fuse, a resistance etc., necessary for operating the light emitting device as designed, a weight of 1 $g/cm^2$ or less can be realized, and more preferably 0.9 $g/cm^2$ or less, 0.8 $g/cm^2$ or less, or 0.7 $g/cm^2$ or less, 0.4 $g/cm^2$ or less, or 0.1 $g/cm^2$ or less can be realized. Thus, a light emitting device of very small weight can be obtained.

From a different point of view, for example, in the use as an alternative to the straight-tube type fluorescent lamps, for example, about 90 to 120 (for example 100) light emitting elements can be arranged at uniform intervals with respect to the substrate member of about 120 cm×1.7 cm area, or about 50 to 70 (for example 60) light emitting elements can be arranged at uniform intervals with respect to the substrate member of about 60 cm×1.7 cm area, and in the light emitting devices having such conformations, a total weight of 10 g or less, preferably 9 g or less, more preferably 8 g or less, further preferably 7 g or less can be realized. More preferably, even with related components, such as a terminal for connection with an external power source, a protective element, a fuse, a resistance etc., necessary for operating the light emitting device as designed, a weight of 10 g or less, more preferably 9 g or less, further preferably 8 g or less, further more preferably 7 g or less can be realized.

Embodiments of the light emitting devices according to the present invention will be described below with reference to the drawings.

Embodiment 1

A light emitting device 100 according to Embodiment 1 includes, as shown in FIG. 1A and FIG. 1B, a substrate member 10, a plurality of light emitting elements 30 arranged on a surface of the substrate member 10, and a plurality of sealing members 20 disposed on the substrate member 10 to cover the plurality of light emitting elements 30 respectively.

The substrate member 10 has a stacked layer structure made up of a flexible base member 11 made of a polyimide (about 25 μm thickness), a plurality of wiring portions 12 (copper foil, about 35 μm thickness) arranged on one surface of the base member 11 and spaced apart from each other by a groove portion 14, and an insulating covering layer 15 (about 15 μm thickness and made of a silicone-based resin containing titanium oxide) disposed over them, which are stacked via an adhesive agent (a silicone-based adhesive agent). Of the wiring portions, the wiring portions 13 extending in the longitudinal direction are respectively connected to the terminals which allow supply of electricity to the wiring portions 12. The substrate member 10 has dimensions (area of 171.15 $cm^2$) of 1141 mm (length)×15 mm (width)×0.09 mm (thickness). In order to establish electrical connection with the light emitting elements 30, parts of the groove portion 14 between the wiring portions 12, and parts of the wiring portion 12 are exposed from the openings of the covering layer 15 in a region of the substrate member 10. The wiring portions 12 respectively have a crank shape and the groove has a width of about 0.3 mm. This indicates that the wiring portions 12, 13 are disposed with a total area of about 75% with respect to the whole area of the substrate member. The light emitting element 30 includes a semiconductor structure, a p-side electrode, and an n-side electrode (not shown). In the semiconductor structure, the p-type semiconductor layer and the light emitting layer are partially removed to expose the n-type semiconductor layer, and an n-side electrode is formed on the exposed surface. A p-side electrode is formed on the upper surface of the p-type semiconductor layer. Thus, the n-side electrode and the p-side electrode are formed on the same surface side with respect to the semiconductor structure. The light emitting element 30 as described above is arranged on a pair of the wiring portions 12 which are exposed from the covering layer 15 of the substrate member 10, with the surface having the n-side electrode and the p-side electrode facing downward, and is electrically connected to the wiring portions via a bonding member 35. The light emitting elements 30 are arranged such that, for example, in a region indicated by X in FIG. 1B, 24 light emitting elements 30 are arranged in series at uniform intervals, and further, five in-series arrangements are arranged in parallel, thus, a total of 120 light emitting elements are arranged in a linear fashion.

A resin layer 40 is arranged on the surface of the substrate member 10 at a periphery of the region where each light emitting element 30 is disposed and a part of the region directly under the light emitting element 30. The resin layer 40 is, for example, made of a silicone resin containing about 30 weight % of titanium oxide. The resin member 40 is arranged from the outer periphery of the light emitting element 30 and on the bonding member 35 to the peripheral region of the light emitting element, on the all portion in the opening and further onto a part of the covering layer 15. The thickness of the resin layer 40 can be approximately the same as the height of the light emitting element 30 at the light emitting element 30 side, and can be gradually reduced on the bonding member 35 to reach about 10 μm thickness on the covering layer 15. The length of the resin layer 40 from the end portion of the light emitting element 30 side to the end portion of the opposite side is about 1 mm.

In the case where the resin layer 40 is arranged at the outer periphery of the light emitting element 30 with a relatively large area, a sealing member 20 can be in contact with the resin layer 40 at a large contact area, so that the sealing member 20 can be firmly adhered to the substrate member 10. Further, the resin layer 40 has a reflectance higher than that of the bonding member 35 and the wiring portion 12, so that extraction of light from the light emitting element can be performed more efficiently.

The sealing member 20 is disposed on the substrate member 10 mounted with the light emitting element 30, on the portions including the light emitting element 30, the resin layer 40 arranged around the light emitting element 30, and a portion of the covering layer 15 disposed from directly under the resin layer 40 on the covering layer 15 arranged on an outer side of the light emitting element 30. The sealing member 20 is, for example, made of a silicone resin containing a total of about 10 weight % of fluorescent materials (LAG and SCASN). That is, the sealing member 20 contains the same type of polymer used to make the resin layer. The outer periphery a of the sealing member 20 is arranged on the covering layer 15 of the substrate member 10. The sealing member 20 is formed in a hemispherical shape by potting etc. The diameter of the sealing member 20 is, for example, about 3.5 mm. The sealing member 20 is disposed containing the same base polymer as in the resin layer 40, thus, the adhesion between the both can be secured. Particularly, in the light emitting device 100, the resin layer 40 and the sealing layer 15 are in contact with each other with the entire surface of the resin layer 40 and all the side surfaces of the resin layer 40 arranged on the covering layer 15, and thus, a further contact area between the resin layer 40 and the sealing member 20 can be secured. Moreover, the resin layer 40 and the sealing member 20 are arranged with containing the same base polymer, so that good suitability and compatibility therebetween can be obtained and thus further firm adhesion can be realized. Moreover, the surfaces and the interface between the bonding member 35 and the wiring portion 12 and the interface between the wiring portion 12 and the reflective layer 15 can be covered with the resin layer 40, so that optical degradation of those members and detachment or the like, due to the optical degradation can be effectively prevented.

On the substrate member 10, as shown in FIG. 1B, electronic components 131 such as a Zener diode, a bridge diode, a connector, a fuse, and/or a resistance is mounted along with a total of 120 light emitting elements 30, the sealing members 20 respectively covering those light emitting elements 30.

Five light emitting devices having the structure as described above were prepared and the total weight of the five light emitting devices was measured. The obtained total weight was then divided by five to obtain a total weight of one light emitting device. Thus, 6.942 g was obtained. Accordingly, the light emitting device has a weight of 0.04 g/cm$^2$ and the light emitting elements are arranged at a density of 0.7/cm$^2$. Also, the brightness of the light emitting device 100 was about 3000 lm at a color temperature of 5000 K.

The light emitting device according to the embodiments of the present invention can realize a significant reduction of weight along with improvements in the performance (brightness etc.) and operation life time etc., compared to that of the conventional fluorescent lamps or the like. As a result, the light emitting device can be applied across a wider range of various conformations and applications.

Embodiment 2

Figure 2A:
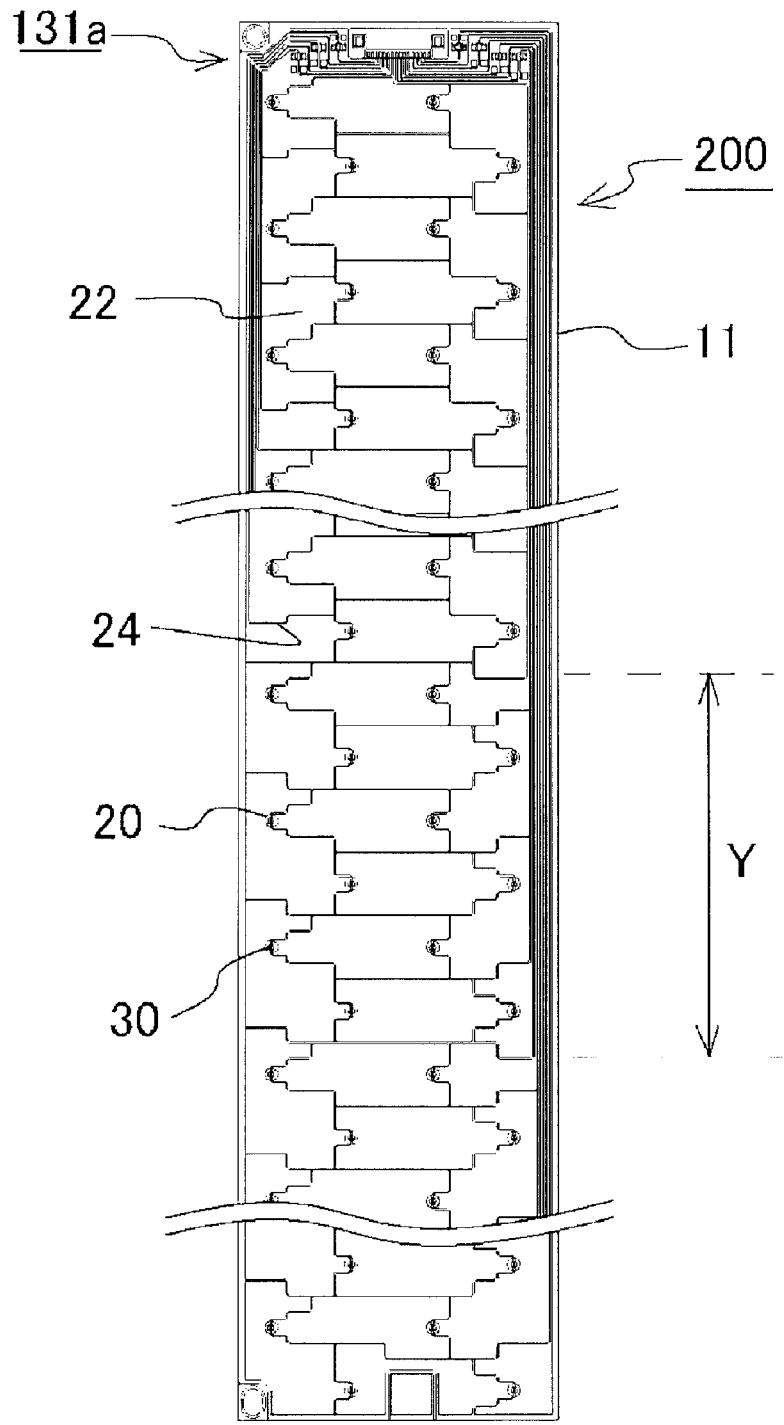
FIG. 2A is a schematic plan view showing a light emitting device according to another embodiment of the present invention.
Figure 2B:
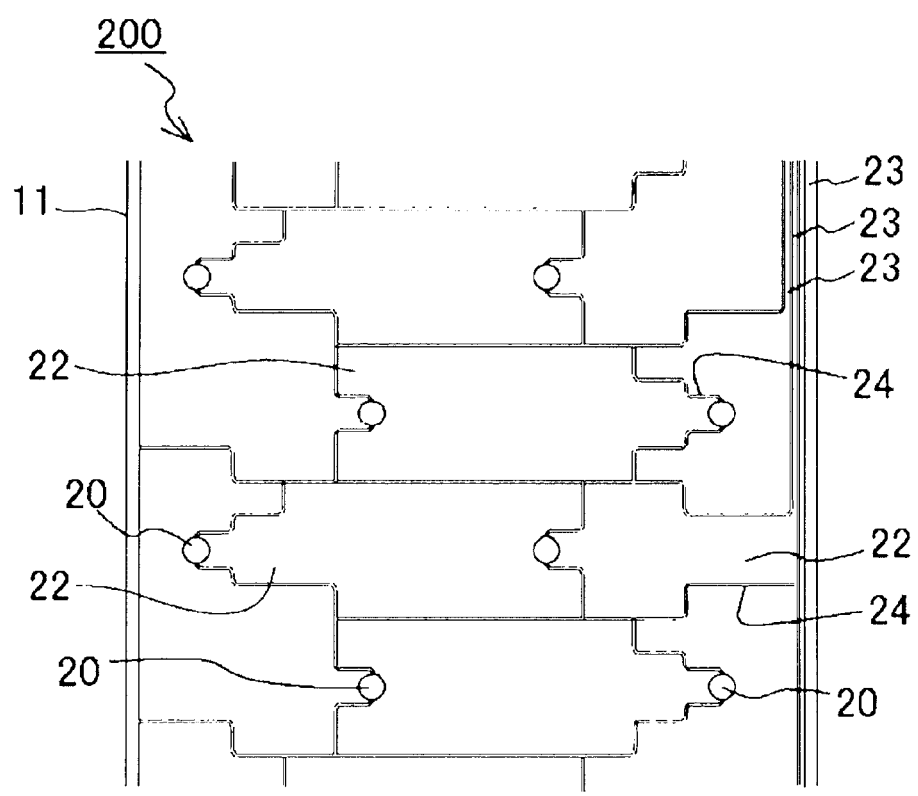
FIG. 2B is a partially enlarged view of FIG. 2A.

A light emitting device 200 according to Embodiment 2 has a substantially similar structure as in the light emitting device 100 of Embodiment 1 except that, for example as shown in FIGS. 2A and 2B, the pattern of the groove portion 24 which separates the wiring portions 22 does not have a simple crank-shape but has step-wise bend portions in both lateral direction and longitudinal direction, and accordingly, the wiring portion 22 is made into crank-like shapes with a plurality of recessed portions and protruded portions in a top view, and also, in order to supply electricity to the wiring portion 22, a part of the wiring portion 22 is integrally formed with the wiring portion 23 extending in the longitudinal direction and is connected to the terminal 131a. In the light emitting device 200, on a substrate member with dimensions of 679.4 mm (length)×79.25 mm (width)×0.09 mm (thickness), 12 light emitting elements 30 are arranged in series, for example, in a region indicated by Y in FIG. 2A, and further, seven in-series arrangements are arranged, thus, a total of 84 light emitting elements are arranged. The wiring portions 22, 23 are disposed with a total area of about 85% with respect to the whole area of the substrate member. Five light emitting devices having the structure as described above were prepared and the total weight of the five light emitting devices was measured. The obtained total weight was then divided by five to obtain a total weight of one light emitting device. Thus, 21.84 g was obtained. Accordingly, the light emitting device has a weight of 0.04 g/cm$^2$ and the light emitting elements are arranged at a density of 0.16/cm$^2$. Also, the brightness of the light emitting device 200 was about 2100 lm at a color temperature of 11,000 K.

Embodiment 3

Figure 3:
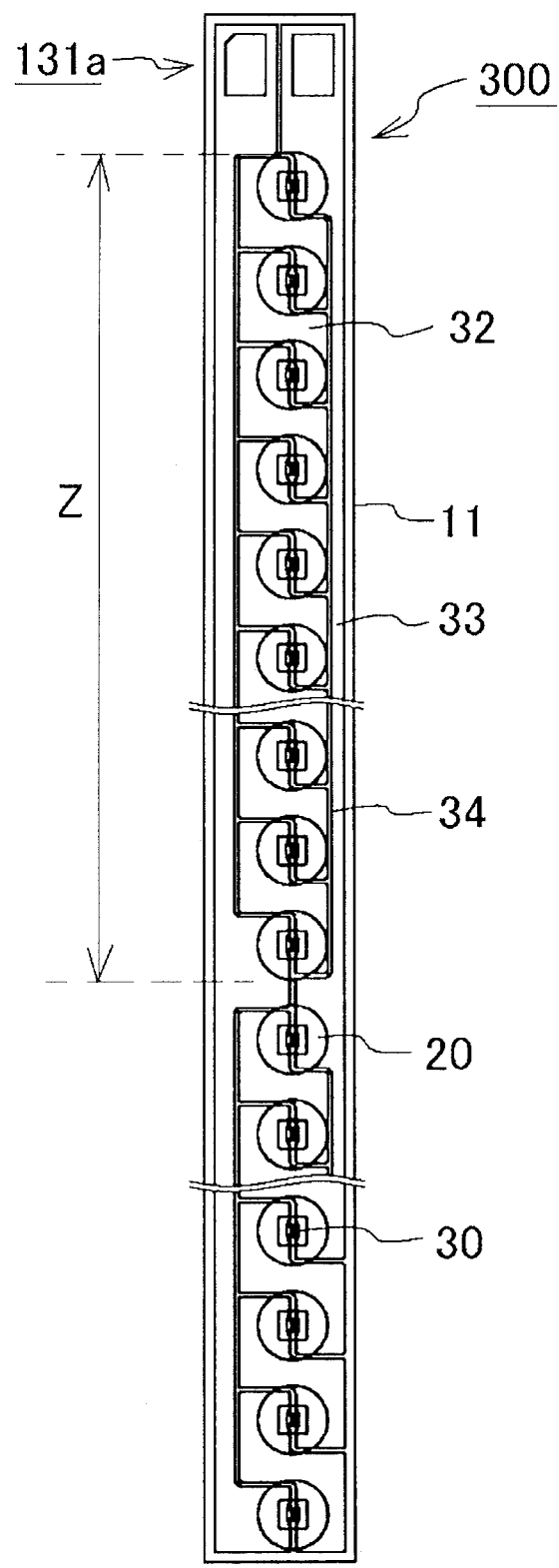
FIG. 3 is a schematic plan view showing a light emitting device according to still another embodiment of the present invention.

A light emitting device 300 according to Embodiment 3 has a substantially similar structure as in the light emitting device 100 of Embodiment 1 except that, for example as shown in FIG. 3, the pattern of the groove portion 24 which separates the wiring portions 32 is arranged in a crank shape extending from an upper side of one side to a lower side of the other side in the longitudinal direction, and also, in order to supply electricity to the wiring portion 22, the wiring portion 33 extends in the longitudinal direction and is connected to the terminal 131a. In the light emitting device 300, on a substrate member with dimensions (area of 24.89 cm$^2$) of 340.96 mm (length)×7.3 mm (width)×0.09 mm (thickness), 18 light emitting elements 30 are arranged in series, for example, in a region indicated by Z in FIG. 3, and further, four in-series arrangements are arranged in parallel, thus, a total of 72 light emitting elements are arranged. The wiring portions 12, 13 are disposed with a total area of about 77% with respect to the whole area of the substrate member. Five light emitting devices having the structure as described above were prepared and the total weight of the five light emitting devices was measured. The obtained total weight was then divided by five to obtain a total weight of one light emitting device. Thus, 1.01 g was obtained. Accordingly, the light emitting device has a weight of 0.04 g/cm$^2$ and the light emitting elements are arranged at a density of 2.89/cm$^2$. Also, the brightness of the light emitting device 300 was about 1800 lm at a color temperature of 11,000 K.

The light emitting device according to the present invention can be used for various kinds of light sources, such as illumination light sources, light sources for various kinds of indicators, light sources for automobile use, light sources for displays, back light sources for liquid crystal displays, light sources for sensors, signals, automobile use, channel control characters for channel boards.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A light emitting device comprising:
   a substrate member including
      a flexible base member,
      a plurality of wiring portions disposed on a surface of the flexible base member, and
      a covering layer covering the wiring portions and having openings respectively exposing a part of wiring portions disposed on the surface of the flexible base member;
   a plurality of light emitting elements bonded directly to the part of the wiring portions, which is exposed from the covering layer and disposed on the surface of the flexible base member, and respectively electrically connected to the wiring portions, and
   a plurality of sealing members respectively sealing the plurality of light emitting elements, the sealing members contacting the substrate member,
   wherein the light emitting device has a mass per area of 1 g/cm² or less, and
   an upper surface of the light emitting element is positioned higher than an upper surface of the covering layer.

2. The light emitting device according to claim 1, further comprising
   an electronic component.

3. The light emitting device according to claim 1, wherein the light emitting elements are arranged with a density of 0.1 to 10/cm².

4. The light emitting device according to claim 1, wherein the light emitting device is configured to emit light with
   a luminosity of at least 900 lm at a color temperature of 5000 K.

5. The light emitting device according to claim 1, wherein the wiring portions are arranged with an area of at least 50% with respect to a total area of the substrate member.

6. The light emitting device according to claim 1, wherein the substrate member has an elongated shape extending in a longitudinal direction, and a ratio of a longitudinal length to a lateral length of the substrate member is in a range of 2:1 to 200:1.

7. The light emitting device according to claim 1, wherein the sealing member has a diameter or length of about twice or greater, and about eight times or less with respect to a length of a side of each of the light emitting elements.

8. The light emitting device according to claim 1, further comprising
   a resin layer disposed laterally to each of the light emitting elements in a corresponding one of the openings formed in the covering layer.

9. The light emitting device according to claim 8, wherein the resin layer contains a reflective material.

10. The light emitting device according to claim 1, further comprising
    a resin layer disposed in a groove portion between the wiring portions and directly under each of the light emitting elements.

11. The light emitting device according to claim 1, wherein
    the covering layer is made of a material which reflects at least light emitted from the light emitting elements.

12. The light emitting device according to claim 1, wherein
    the wiring portions are arranged with an area 70% or greater with respect to an area of the flexible base member.

13. The light emitting device according to claim 1, wherein
    a pair of adjacent wiring portions of the wiring portions is arranged such that the adjacent wiring portions are spaced apart from each other directly under one of the light emitting elements.

14. The light emitting device according to claim 1, wherein
    the flexible base member covers an entire portion directly under each of the light emitting elements.

15. A light emitting device comprising:
    a substrate member including a flexible base member and a wiring substrate;
    a covering member covering the wiring substrate, the covering member defining a plurality of openings exposing a part of the wiring substrate disposed on the flexible base member;
    a plurality of light emitting elements respectively bonded directly to the part of the wiring substrate, which is exposed in the openings in the covering member and disposed on the flexible base member; and
    a sealing member sealing the light emitting element, the sealing member contacting the covering member;
    the substrate member having a ratio of a longitudinal length to a lateral length in a range of 2:1 to 200:1, and
    the substrate member having a diameter or length of about twice or greater, and about eight times or less with respect to a length of a side of each of the light emitting elements,
    an upper surface of the light emitting element being positioned higher than an upper surface of the covering layer.

16. The light emitting device according to claim 15, wherein
    the light emitting device has a mass per area of 1 g/cm² or less.

17. The light emitting device according to claim 15, wherein
    the substrate member has a width of 0.5 cm to 5 cm and a length of 100 cm to 150 cm.

18. The light emitting device according to claim 15, wherein
    the substrate member has a width of 0.5 cm to 5 cm and a length of 20 cm to 70 cm.

19. The light emitting device according to claim 15, further comprising
    a resin layer disposed laterally to each of the light emitting elements in a corresponding one of the openings formed in the covering layer, an outer periphery of the corresponding one of the openings, or from an inner side of the corresponding one of the openings toward an outer periphery of the corresponding one of the openings.

20. The light emitting device according to claim 19, wherein
    the resin layer contains a reflective material.

21. The light emitting device according to claim 15, wherein
    the wiring substrate includes at least a pair of wiring portions with a groove portion being disposed between the pair of wiring portions,
    each of the light emitting elements is disposed over the groove portion, and the light emitting device further includes a resin layer disposed in the groove portion and directly under each of the light emitting elements.

22. The light emitting device according to claim 15, wherein
the light emitting elements are bonded to the wiring substrate by a bonding member, and
the light emitting device further includes a resin layer covering at least a part of a surface of the bonding member.

23. The light emitting device according to claim 15, wherein
a pair of adjacent wiring portions of the wiring portions is arranged such that the adjacent wiring portions are spaced apart from each other directly under one of the light emitting elements.

* * * * *